United States Patent
Okita et al.

(10) Patent No.: US 10,297,489 B2
(45) Date of Patent: May 21, 2019

(54) PLASMA PROCESSING METHOD AND PLASMA PROCESSING APPARATUS

(71) Applicant: Panasonic Intellectual Property Management Co., Ltd., Osaka (JP)

(72) Inventors: Shogo Okita, Hyogo (JP); Atsushi Harikai, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/427,590

(22) Filed: Feb. 8, 2017

(65) Prior Publication Data

US 2017/0271194 A1 Sep. 21, 2017

(30) Foreign Application Priority Data

Mar. 18, 2016 (JP) .................. 2016-054776

(51) Int. Cl.
| | |
|---|---|
| *H01L 21/67* | (2006.01) |
| *H01L 21/687* | (2006.01) |
| *H01L 21/3065* | (2006.01) |
| *H01J 37/32* | (2006.01) |

(52) U.S. Cl.
CPC .. *H01L 21/68785* (2013.01); *H01J 37/32082* (2013.01); *H01J 37/32724* (2013.01); *H01J 37/32935* (2013.01); *H01L 21/3065* (2013.01); *H01L 21/67069* (2013.01); *H01L 21/67248* (2013.01); *H01L 21/67259* (2013.01); *H01J 2237/334* (2013.01)

(58) Field of Classification Search
CPC ........... H01L 21/68785; H01L 21/3065; H01L 21/67248; H01L 21/67259; H01L 21/67069; H01J 37/32082; H01J 37/32724; H01J 37/32935; H01J 2237/334

See application file for complete search history.

(56) References Cited

U.S. PATENT DOCUMENTS

| | | | |
|---|---|---|---|
| 8,691,702 B2* | 4/2014 | Geerpuram ....... | H01J 37/32495 438/731 |
| 9,554,484 B2* | 1/2017 | Rogers ..................... | A61B 5/01 |
| 9,779,986 B2* | 10/2017 | Harikai ............. | H01L 21/76826 |
| 10,037,891 B2* | 7/2018 | Okita .................. | H01L 21/3065 |
| 2010/0216313 A1* | 8/2010 | Iwai .................. | H01J 37/32623 438/729 |

(Continued)

FOREIGN PATENT DOCUMENTS

| | | |
|---|---|---|
| JP | H09-022899 A | 1/1997 |
| JP | 2014-513868 A | 6/2014 |

*Primary Examiner* — Savitri Mulpuri
(74) *Attorney, Agent, or Firm* — Pearne & Gordon LLP

(57) ABSTRACT

A plasma processing method includes a mounting process of mounting a holding sheet holding a substrate in a stage provided in a plasma processing apparatus, and a fixing process of fixing the holding sheet to the stage. The plasma processing method further includes a determining process of determining whether or not a contact state of the holding sheet with the stage is good or bad after the fixing process, and a plasma etching process of etching the substrate by exposing a surface of the substrate to plasma on the stage, in a case in which the contact state is determined to be good in the determining process.

12 Claims, 19 Drawing Sheets

(56) References Cited

U.S. PATENT DOCUMENTS

| | | |
|---|---|---|
| 2013/0065378 A1 | 3/2013 | Johnson et al. |
| 2015/0340203 A1* | 11/2015 | Matsubara ............ C23C 16/505 |
| | | 216/67 |
| 2017/0069536 A1* | 3/2017 | Harikai ............. H01L 21/76826 |
| 2017/0271194 A1* | 9/2017 | Okita ................ H01L 21/68785 |
| 2018/0240697 A1* | 8/2018 | Okita ..................... H01J 37/00 |

* cited by examiner

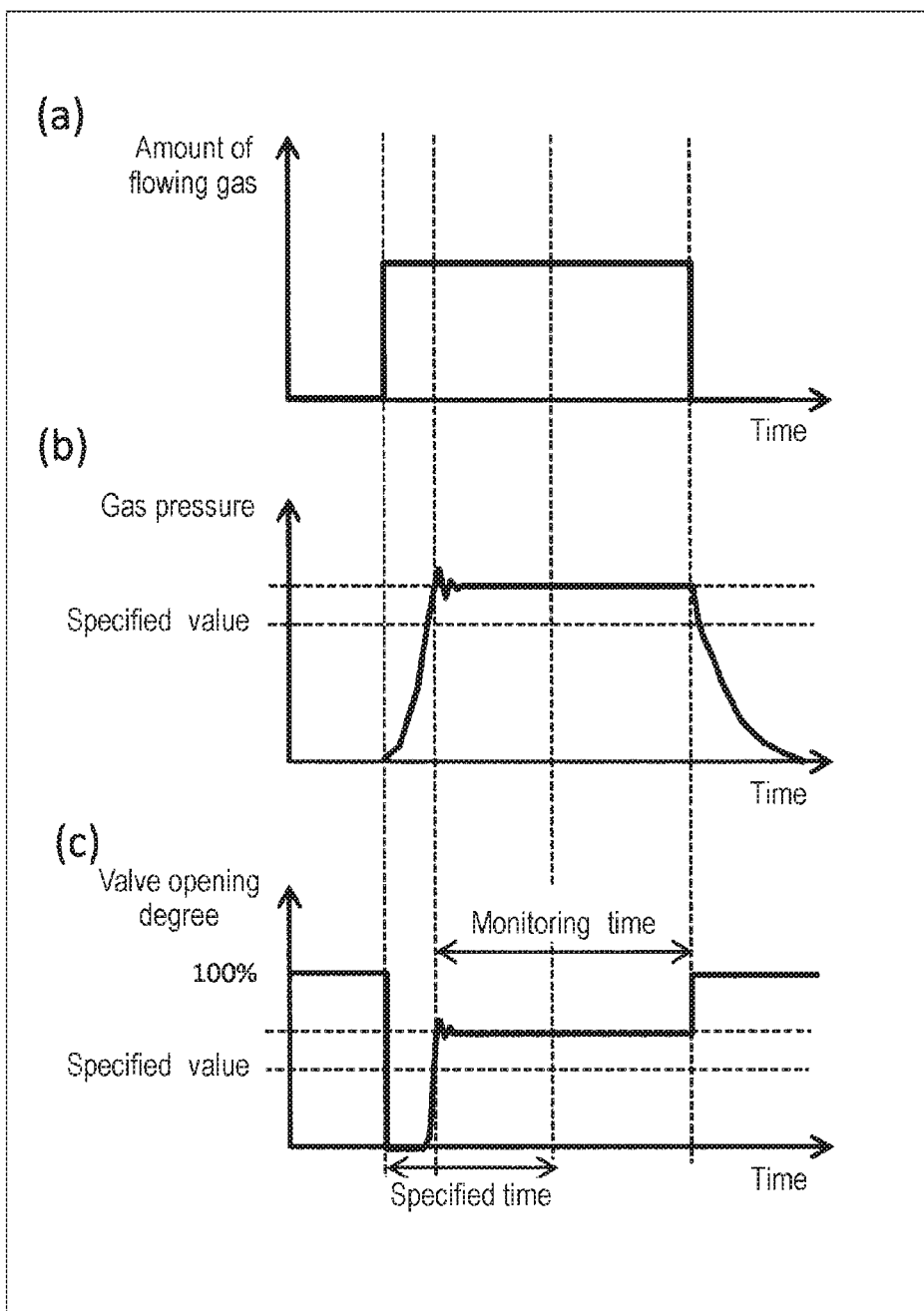

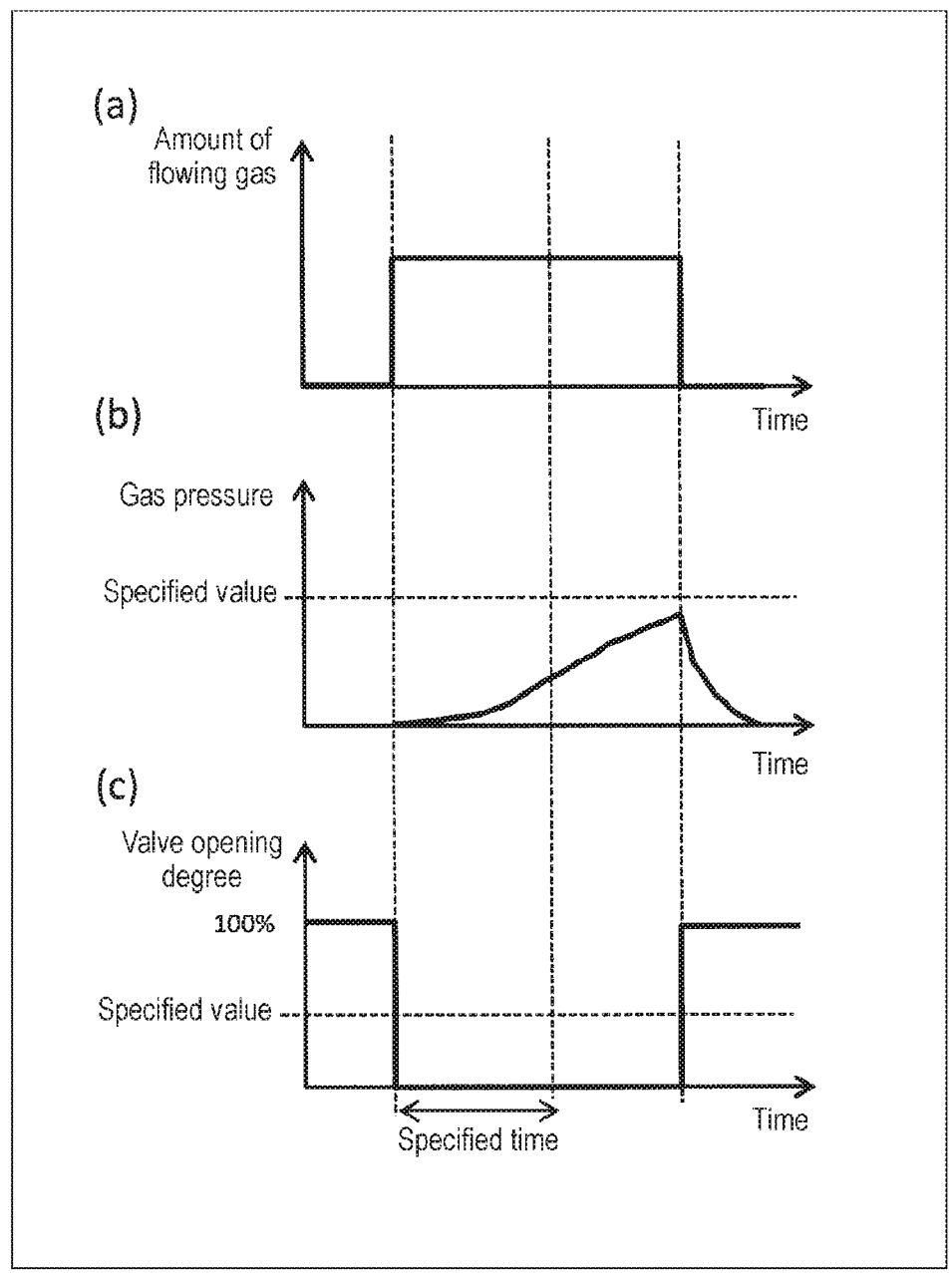

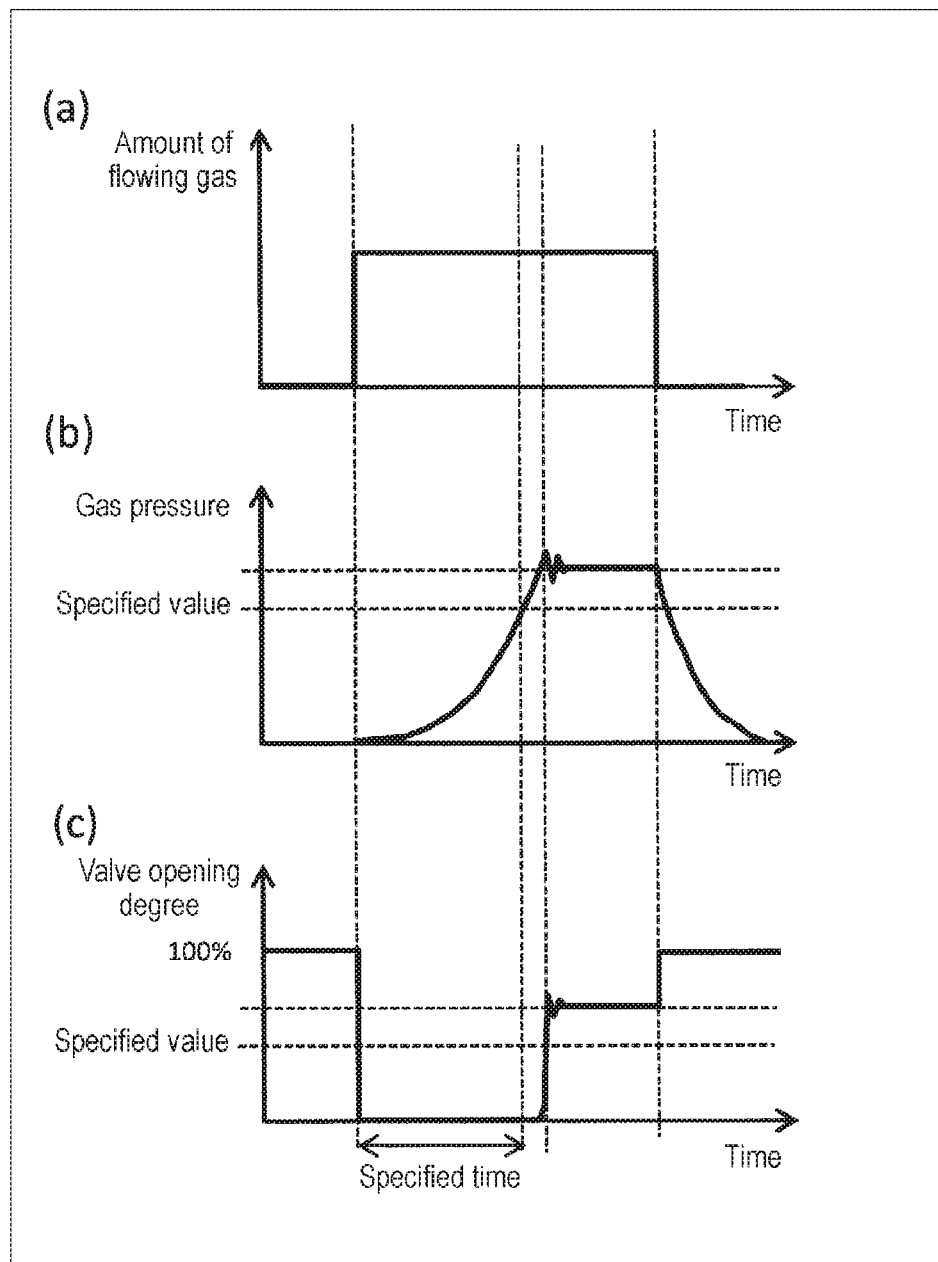

(a)

(b)

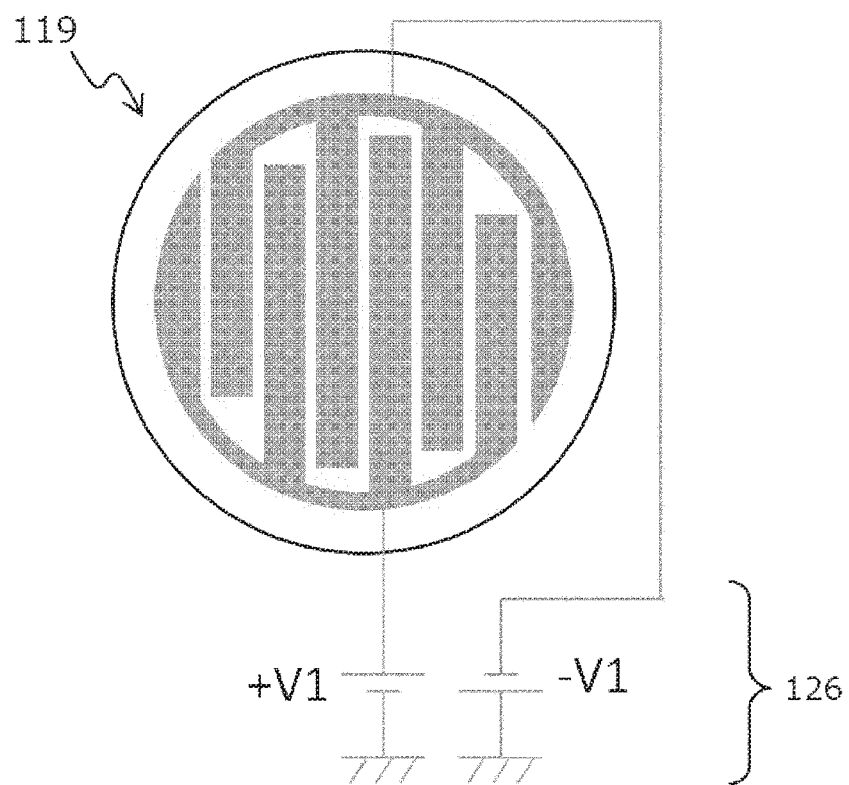

PLASMA PROCESSING METHOD AND PLASMA PROCESSING APPARATUS

BACKGROUND

1. Technical Field

The present disclosure relates to a method and an apparatus of plasma-processing a substrate which is held by a holding sheet.

2. Description of the Related Art

As a method of dicing a substrate, a plasma dicing, in which a substrate with a mask formed thereon is plasma-etched and is divided into individual chips, has been known. PTL 1 discloses that the substrate is mounted on a stage provided in a plasma processing apparatus in a state in which the substrate is held by a transportation carrier which is provided with a frame and a holding sheet covering an opening thereof, and plasma process is performed thereon, in order to improve handling properties of the substrate when transporting, and the like.

CITATION LIST

Patent Literature

PTL 1: PCT Japanese Translation Publication No. 2014-513868

SUMMARY

A thickness of a holding sheet is thin so as to be easily bent. Therefore, there is a case in which a transportation carrier holding a substrate is mounted in a stage in a state in which wrinkle is generated in the holding sheet. When a plasma process is performed in a state in which the wrinkle is remained on the holding sheet, abnormal discharge occurs in a part of the wrinkle, or a temperature of the part of wrinkle is increased, and thus the plasma process is difficult to be normally performed.

Recently, electronic devices become small and thin, and thus a thickness of an IC chip, and the like mounted on the electronic device is reduced. Accordingly, a thickness of a substrate for forming the IC chip, or the like which is a target to be diced is reduced, and the substrate is also easily bent like the holding sheet. In a case in which such a substrate, which is easily bent, is attached to and held by the holding sheet, which is easily bent, if wrinkle is generated in the holding sheet, wrinkle is also easily generated in the substrate. Further, if distortion is slightly generated in a frame, the wrinkle is further easily generated in the holding sheet and the substrate.

The plasma process is generally performed by mounting the transportation carrier in the stage and being brought into contact by an electrostatic adsorption mechanism which is called an electrostatic chuck. The electrostatic suction mechanism applies a voltage to an electrode for electrostatic chucking (hereinafter, refer to as ESC electrode), which is disposed inside the stage, and sucks the holding sheet to the stage by Coulomb force or Johnson-Rahbeck force acting between the ESC electrode and the holding sheet. At this time, the holding sheet holding the substrate may be mounted in the stage in a state in which wrinkle is generated. The holding sheet is pressed by the stage in a state in which a part of the sheet is floated from the stage by the wrinkle generated in the holding sheet. Therefore, contacting of the substrate and the stage through the holding sheet is not sufficient.

When the plasma process is performed in a state in which contacting of the substrate and the stage through the holding sheet is not sufficient, etching with respect to the substrate is not uniform, and thus a processing shape is varied or unprocessed part is generated. Further, there is a case in which a temperature of the substrate is locally increased, or abnormal discharging is generated. Due to this increasing of the temperature or abnormal discharging, it is concerned that the substrate, the holding sheet, and the ESC electrode are damaged. As a result, a yield of a product is deteriorated.

An aspect of the disclosure relates to a plasma processing method, and includes processes as follows. That is, the plasma processing method includes a mounting process of mounting a holding sheet holding a substrate in a stage provided in a plasma processing apparatus, and a fixing process of fixing the holding sheet to the stage. Further, a determining process of determining whether or not a contact state of the holding sheet with the stage is good or bad after the fixing process, and a plasma etching process of etching the substrate by exposing a surface of the substrate to plasma on the stage, in a case in which the contact state is determined to be good in the determining process.

Another aspect of the disclosure relates to a plasma processing apparatus including a processing chamber, a stage which is provided in the processing chamber and mounts a holding sheet for holding a substrate, a fixing mechanism which fixes the holding sheet to the stage, a high frequency power source which generates plasma inside the processing chamber, and a determiner which determines whether or not a contact state of the holding sheet with the stage is good or bad.

According to the disclosure, the plasma process is performed after the contact state of the substrate and the stage through the holding sheet is checked, and thus the yield of the product is improved.

BRIEF DESCRIPTION OF THE DRAWINGS

FIG. 7A is a graph ((a) to (c)) illustrating a contact state of a substrate and the stage through a holding sheet is good, in a determining process of the plasma processing method according to the first embodiment;

FIG. 7B is a graph ((a) to (c)) illustrating the contact state of the substrate and the stage through the holding sheet is bad, in the determining process of the plasma processing method according to the first embodiment;

FIG. 7C is a graph ((a) to (c)) illustrating the contact state of the substrate and the stage through the holding sheet is bad, in a determining process of the plasma processing method according to the first embodiment;

FIG. 14 is a concept diagram illustrating an ESC electrode according to the embodiments of disclosure.

DETAILED DESCRIPTION

A plasma processing method according to the embodiment includes a mounting process of mounting a holding sheet of holding a substrate to a stage provided in a plasma processing apparatus, and a fixing process of fixing the holding sheet to the stage. Also, after the fixing process, a determining process of determining whether or not a contact state of the stage of the holding sheet is good or bad, and a plasma etching process in which in a case in which the contact state in the determining process is determined to be good, the substrate is etched by exposing a surface of a substrate on the stage with plasma, are included. Accordingly, since the plasma process is performed after a contact state of the substrate and the stage through the holding sheet is confirmed to be good, failure of the plasma process is suppressed. As a result, a yield of product is improved.

Figure 1A:
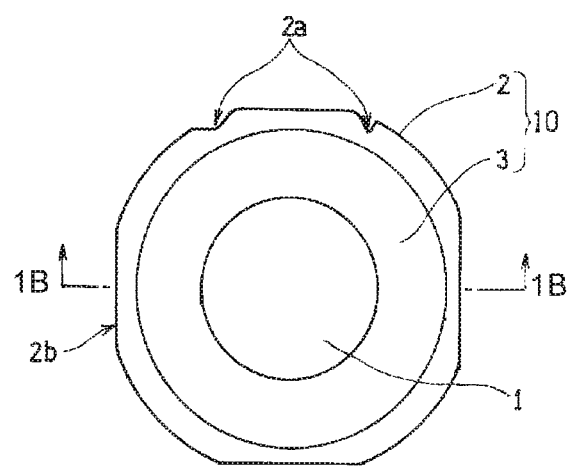
FIG. 1A is a top view schematically illustrating a transportation carrier holding a substrate according to an embodiment of the disclosure.
Figure 1B:
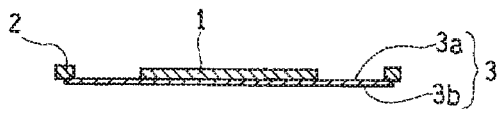
FIG. 1B is a sectional view, which is taken along a line of IB-IB in FIG. 1A, of the transportation carrier holding the substrate according to the embodiment.

First, the embodiment of the transportation carrier used in the disclosure will be described with reference to FIG. 1A and FIG. 1B. FIG. 1A is a top view schematically illustrating substrate 1 and transportation carrier 10 holding the substrate, and FIG. 1B is a sectional view, which is taken along a line of IB-IB illustrated in FIG. 1A, of substrate 1 and transportation carrier 10. As illustrated in FIG. 1A, transportation carrier 10 is provided with frame 2 and holding sheet 3. In holding sheet 3, the outer circumferential part thereof is fixed to frame 2. Substrate 1 is attached to holding sheet 3 and is held by transportation carrier 10. In FIG. 1A and FIG. 1B, a case in which frame 2 and substrate 1 are substantially circular shape is illustrated, but it is not limited thereto.

Substrate

Substrate 1 is a target to be plasma-processed. Substrate 1 is manufactured, for example, by grinding a rear surface of the body on an opposite side of a circuit layer and making a thickness thereof thin, after the circuit layer constituted by a semiconductor circuit, an electronic component element, and MEMS is formed on a surface of a part of a body. An electronic component (not illustrated) including the circuit layer described above is obtained by dividing substrate 1 into individual pieces.

A size of substrate 1 is not particularly limited, and for example, a maximum diameter thereof is substantially 50 mm to 300 mm. A thickness of substrate 1 is substantially 25 μm to 150 μm, and is very thin. Therefore, substrate 1 barely has rigidity (self supporting characteristics). Here, the outer circumferential part of holding sheet 3 is fixed to substantially flat frame 2, and substrate 1 is attached to holding sheet 3. Accordingly, transporting of substrate 1, or the like is easily handled. A shape of substrate 1 is not also limited, and for example, is circular or square shape. In substrate 1, an orientation flat and a notch (neither is illustrated) may be provided.

A material of the body of the substrate is also particularly not limited, and for example, as the material, a semiconductor, a dielectric, a metal, or a laminated body thereof is exemplified. As the semiconductor, silicon (Si), gallium arsenide (GaAs), gallium nitride (GaN), silicon carbide (SiC), and the like can be exemplified. As the dielectric, a resin film such as polyimide, a low dielectric constant film (Low-k film), silicon dioxide ($SiO_2$), silicon nitride ($Si_3N_4$), lithium tantalate ($LiTaO_3$), lithium niobate ($LiNbO_3$), or the like can be exemplified.

A desired shape mask is formed on a surface which is not attached to holding sheet 3 of substrate 1 (not illustrated). A part where the mask is formed is protected from being etched due to plasma. A part where the mask is not formed can be etched due to plasma from a surface to a rear surface thereof. As the mask, for example, a resist mask being formed by exposing and developing a resist film can be used. Also, the mask may be formed by, for example, opening a resin film formed on a surface of substrate 1 by laser scribing.

Frame

Frame 2 is a frame including an opening having an area equal to or greater than the entirety of substrate 1, and includes a predetermined width and a substantial constant thin thickness. Frame 2 has a rigidity which is capable of transporting holding sheet 3 and substrate 1 in a holding state.

A shape of the opening of frame 2 is not particularly limited, and for example, may be a circular shape, or polygonal shape, such as a rectangular or a hexagonal shape. In frame 2, notch 2a for determining a position or corner cut 2b may be provided. As a material of frame 2, for example, a metal such as aluminum or stainless steel, or resin is exemplified. The vicinity of the outer circumference of one surface of holding sheet 3 is attached to one surface of frame 2.

Holding Sheet

Holding sheet 3 is provided with, for example, a surface (adhesive surface 3a) including adhesion and a surface (non adhesive surface 3b) not including the adhesion. An outer circumference of adhesive surface 3a is attached to a surface of one side of frame 2, and covers an opening of frame 2.

Substrate 1 is attached to a part exposed from the opening of frame 2 of adhesive surface 3a.

It is preferable that adhesive surface 3a is made of adhesive component where adhesion power is reduced by irradiation of ultraviolet (UV). When irradiation of ultraviolet is performed after dicing, a substrate (electronic component) which is divided into individual pieces is easily peeled off from adhesive surface 3a, and thus it is easily picked up. For example, holding sheet 3 is obtained by applying UV curable acrylic adhesion to one surface of a material of a base material of a film shape at a thickness of 5 μm to 20 μm.

The material of the base material of a film shape is not particularly limited, and for example, thermoplastic resin, such as polyolefin such as polyethylene and polypropylene, and polyesters such as polyethylene terephthalate are exemplified. In the base material, various additives, such as a rubber component for adding stretch properties (for example, ethylene-propylene rubber (EPM), ethylene-propylene-diene rubber (EPDM), and the like), a plasticizer, a softening agent, an antioxidant, and a conductive material may be blended. The thermoplastic resin described above may include a functional group indicating photopolymerization reaction of an acryl group, and the like. A thickness of the base material is, for example, 50 μm to 150 μm. At the time of the plasma process, transportation carrier 10 is mounted in the stage so that the stage comes into contact with non adhesive surface 3b.

Plasma Processing Apparatus

Figure 2:
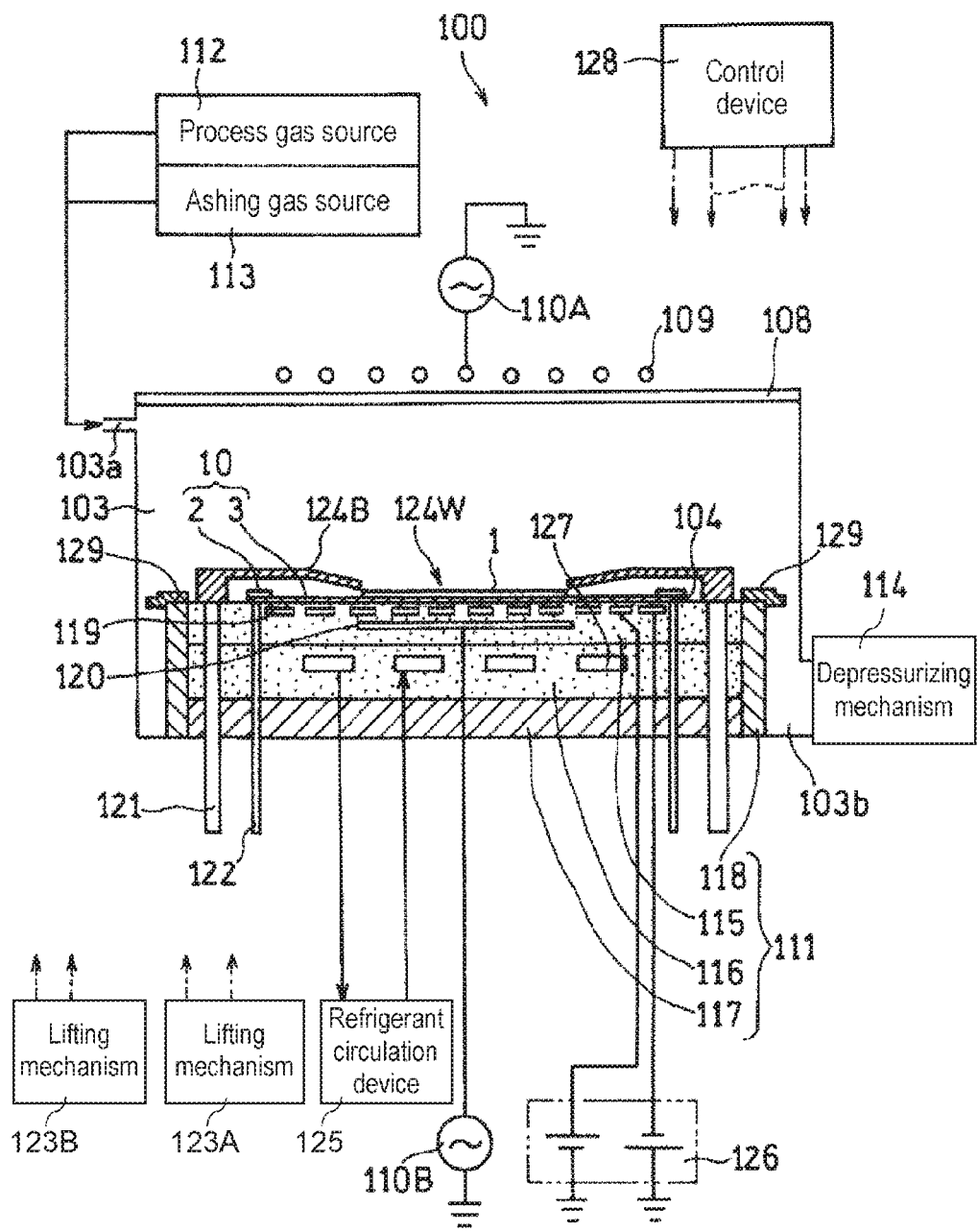
FIG. 2 is a concept diagram illustrating a sectional surface of a basic structure of a plasma processing apparatus according to the embodiment of the disclosure.

Next, referring to FIG. 2, a base structure of plasma processing apparatus 100 according to the embodiment of the disclosure will be described. FIG. 2 schematically illustrates a sectional view of the base structure of plasma processing apparatus 100.

Plasma processing apparatus 100 is provided with stage 111. Transportation carrier 10 is mounted in stage 111 so that a surface holding substrate 1 of holding sheet 3 is set to be toward an upper side. Stage 111 has a size capable of mounting the entirety of transportation carrier 10. Cover 124, which includes window 124W for covering at least a part of frame 2 and holding sheet 3 and exposing at least a part of substrate 1, is disposed above stage 111.

Stage 111 and cover 124 is disposed inside a processing chamber (vacuum chamber 103). An upper portion of vacuum chamber 103 has a generally opened cylindrical shape, and an upper portion opening is closed by dielectric member 108 which is a lid. As a material constituting vacuum chamber 103, aluminum, stainless steel (SUS), aluminum in which a surface thereof is alumite-processed, and the like can be exemplified. As a material constituting dielectric member 108, a dielectric material such as yttrium oxide ($Y_2O_3$), aluminum nitride (AlN), alumina ($Al_2O_3$), and quartz ($SiO_2$) can be exemplified. Antenna 109 is disposed above dielectric member 108 as an upper electrode. Antenna 109 is electrically connected to first high frequency power source 110A. Stage 111 is disposed on a bottom side inside vacuum chamber 103.

Gas introducing port 103a is connected to vacuum chamber 103. In gas introducing port 103a, process gas source 112 and ashing gas source 113 which are gas supplying sources for generating plasma are respectively connected by a tube. In vacuum chamber 103, exhausting port 103b is provided, and in exhausting port 103b, depressurizing mechanism 114 including a vacuum pump for exhausting and depressurizing gas inside vacuum chamber 103 is connected.

Stage 111 is provided with electrode layer 115, metal layer 116, base 117 supporting electrode layer 115 and metal layer 116, and outer circumferential part 118 surrounding electrode layer 115, metal layer 116, and base 117. Outer circumferential part 118 is constituted by a metal having conductivity and etching resistance properties, and protects electrode layer 115, metal layer 116, and base 117 from plasma. Annular outer circumference ring 129 is disposed on the upper surface of outer circumferential part 118. Outer circumference ring 129 has a function of protecting the upper surface of outer circumferential part 118 from the plasma. Electrode layer 115 and outer circumference ring 129 are constituted by, for example, the dielectric material described above.

Inside electrode layer 115. ESC electrode 119 constituting an electrostatic adsorption mechanism, and high frequency electrode 120 electrically connected to second high frequency power source 110B are disposed. In ESC electrode 119, DC power source 126 is electrically connected. The electrostatic adsorption mechanism is configured with ESC electrode 119 and DC power source 126. Holding sheet 3 is pressed and fixed to stage 111 by the electrostatic adsorption mechanism. Hereinafter, as a fixing mechanism for fixing holding sheet 3 to stage 111, a case, in which the electrostatic adsorption mechanism is provided, is exemplified and described, and it is not limited thereto. Fixing of holding sheet 3 to stage 111 may be performed by a clamp which is not illustrated.

Metal layer 116 is made of, for example, aluminum in which a surface is alumite-coated. Refrigerant flow passage 127 is formed inside metal layer 116. Refrigerant flow passage 127 cools stage 111. When stage 111 is cooled, holding sheet 3 mounted in stage 111 is cooled, and cover 124 in which a part is in contact with stage 111 is also cooled. Accordingly, damage of substrate 1 or holding sheet 3 which is generated by being heated during the plasma process is suppressed. Refrigerant inside refrigerant flow passage 127 is circulated by refrigerant circulation device 125.

A plurality of supporter 122 is disposed on the vicinity of circumference of stage 111 penetrating stage 111. Supporter 122 is lifted and driven by lifting mechanism 123A. When transportation carrier 10 is transported into vacuum chamber 103, the carrier is delivered by supporter 122 which is increased up to a predetermined position. The supporter 122 supports frame 2 of transportation carrier 10. When an upper end surface of supporter 122 is dropped lower than the same level as that of stage 111, transportation carrier 10 is mounted in a predetermined position of stage 111.

A plurality of lifting rods 121 is connected to an end of cover 124, and cover 124 can be lifted. Lifting rods 121 is lifted and driven by lifting mechanism 123B. Lifting operation of cover 124 by lifting mechanism 123B can be independently performed from lifting mechanism 123A.

Control device 128 controls operation of an element constituting plasma processing apparatus 100, which includes first high frequency power source 110A, second high frequency power source 110B, process gas source 112, ashing gas source 113, depressurizing mechanism 114, refrigerant circulation device 125, lifting mechanism 123A, lifting mechanism 123B, and the electrostatic adsorption mechanism.

Figure 3:
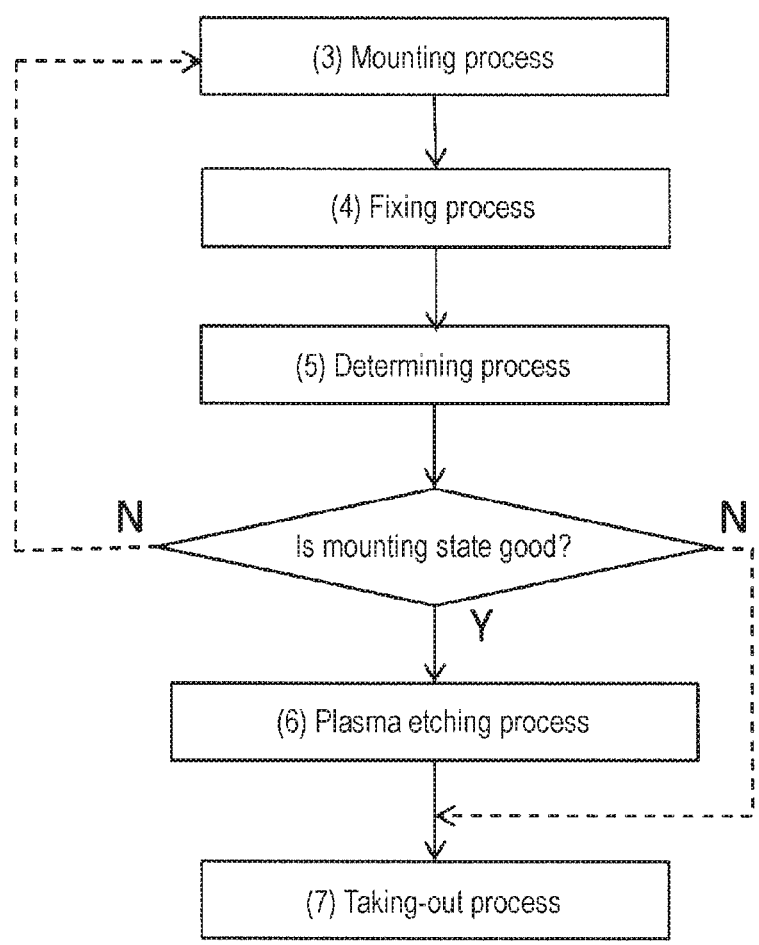
FIG. 3 is a flow chart illustrating a process of a part of the plasma processing method according to the embodiment of the disclosure.

Next, a basic process of the plasma processing method according to the embodiment will be described with reference to FIG. 3. FIG. 3 is a flow chart illustrating a process of a part of the plasma processing method.

(1) Preparing Process

First, transportation carrier 10 is prepared. Transportation carrier 10 is obtained by adhering and fixing holding sheet 3 to a surface of one side of frame 2. At this time, as illustrated in FIG. 1B, adhesive surface 3a of holding sheet 3 faces the frame. Next, substrate 1 is held by transportation carrier 10 by attaching to substrate 1 adhesive surface 3a of holding sheet 3.

(2) Carrying Process

Next, transportation carrier 10 held by substrate 1 is carried in vacuum chamber 103.

In vacuum chamber 103, cover 124 is lifted to a predetermined position by driving lifting rods 121. Continuously, shutter 222 is opened, transportation carrier 10 held by transportation arm 221 (referring to FIG. 8) is carried in from a load lock chamber which is not illustrated. A plurality of supporters 122 is waited in a state of being lifted. When transportation carrier 10 reaches a predetermined position above stage 111, supporter 122 receives transportation carrier 10. Transportation carrier 10 is mounted on an upper end surface of supporter 122 so that a surface holding substrate 1 of holding sheet 3 faces upward.

(3) Mounting Process

When transportation carrier 10 receives supporter 122, if transportation arm 221 is exited, shutter 222 is closed, and vacuum chamber 103 becomes in a sealed state. Next, supporter 122 starts to be dropped. When the upper end surface of supporter 122 is dropped lower than the same level as stage 111, transportation carrier 10 is mounted in stage 111. Continuously, lifting rods 121 is driven. Lifting rods 121 makes cover 124 dropped to a predetermined position. At this time, so that cover 124 is capable of covering frame 2 without coming into contact with transportation carrier 10, a distance between cover 124 and stage 111 is regulated. Accordingly, a part where frame 2 and substrate 1 of holding sheet 3, which is not held, is covered with cover 124 without coming into contact with cover 124, and substrate 1 is exposed from window 124W of cover 124.

Cover 124 is, for example, a donut shape having external contour of a substantially circular shape, and has a constant width and thin thickness. An inner diameter (diameter of window 124W) of cover 124 is smaller than an inner diameter of frame 2, and an outer diameter of cover 124 is greater than an outer diameter of frame 2. Therefore, when transportation carrier 10 is mounted on a predetermined position of the stage, and cover 124 is dropped, cover 124 is capable of covering a part of at least frame 2 and holding sheet 3. At least a part of substrate 1 is exposed from window 124W. Cover 124 is made of, for example, a dielectric such as ceramics (for example, alumina, aluminum nitride, and the like) or quartz, metal such as aluminum, or aluminum in which a surface is alumite-processed, or the like.

(4) Fixing Process

In a fixing process, transportation carrier 10 mounted in stage 111 is fixed onto stage 111. In a case in which stage 111 is provided with ESC electrode 119, adhesion force is generated between holding sheet 3 of transportation carrier 10 and stage 111 by applying voltage to ESC electrode 119, and holding sheet 3, further, transportation carrier 10 can be fixed to stage 111.

ESC electrode 119 is roughly divided into two types of unipolar type and bipolar type.

Unipolar type ESC electrode 119 includes at least one electrode. In a case in which two or more electrodes are included in unipolar type ESC electrode 119, all of them are applied with the same polarity. The electrostatic adsorption mechanism including unipolar type ESC electrode 119 uses coulomb force as a adsorption mechanism. When voltage is applied to ESC electrode 119, electric charge due to dielectric polarization is induced in a surface of stage 111 constituting by the dielectric, and holding sheet 3 mounted on stage 111 is charged. As a result, the coulomb force is acted between the electric charge induced in the surface of stage 111 and the charged holding sheet 3, and transportation carrier 10 is sucked to stage 111. In order to charge holding sheet 3, plasma is generated in vacuum chamber 103, and holding sheet 3 is exposed to the generated plasma.

Meanwhile, the bipolar type ESC electrode 119 is provided with a positive electrode and a negative electrode, and different polarities are respectively applied to the positive electrode and the negative electrode. As the bipolar type ESC electrode 119, for example, a comb-shaped electrode as illustrated in FIG. 14 is used. Voltage of V1 is applied to the positive electrode from DC power source 126, and voltage of −V1 is applied to the negative electrode from DC power source 126.

As adsorption mechanism of the electrostatic adsorption mechanism including the bipolar type ESC electrode 119, there is a case of using coulomb force, and a case of using Johnson-Rahbeck force. According to the adsorption mechanism, a structure of ESC electrode 119 or a material constituting ESC electrode 119 (for example, ceramics) is appropriately selected. Even in a case of any adsorption mechanism, adsorption force is generated between the ESC electrode and holding sheet 3 by respectively applying voltage having different polarities to the positive electrode and the negative electrode, and transportation carrier 10 can be sucked to stage 111. In a case of the bipolar type, holding sheet 3 does not need to be charged for sucking different from a case of the unipolar type.

The bipolar type ESC electrode can be functioned as the unipolar type by a method of applying voltage to the positive electrode and the negative electrode. Specifically, a voltage having the same polarity is applied to the positive electrode and the negative electrode, and thus the bipolar type ESC electrode can be used as the unipolar type ESC electrode, hereinafter, a case in which a voltage having different polarities is respectively applied to the positive electrode and the negative electrode of the bipolar type ESC electrode is referred to as a bipolar mode, and a case in which a voltage having the same polarity is applied to the positive electrode and the negative electrode is referred to as a unipolar mode.

In a case of the unipolar mode, the voltage having the same polarity is applied to the positive electrode and the negative electrode, and the coulomb force is used as the adsorption mechanism. Unlike the case of bipolar mode, transportation carrier 10 cannot be sucked by only applying the voltage to the positive electrode and the negative electrode. In the unipolar mode, in order to suck transportation carrier 10, holding sheet 3 needs to be charged. Therefore, in a case of sucking the carrier in the unipolar mode, plasma is generated in vacuum chamber 103, holding sheet 3 is exposed to the generated plasma, and thus holding sheet 3 is charged. Accordingly, transportation carrier 10 is sucked to stage 111. Hitherto, the unipolar type and the bipolar type ESC electrode 119 have been described, but even when either of types is used, transportation carrier 10 can be sucked to the stage.

Also, in a case of unipolar type ESC electrode 119 or the unipolar mode, it is preferable that the plasma generated for sucking transportation carrier 10 to stage 111 is generated at low power, when compared to plasma generated in a plasma etching process to be described later. This is because that transportation carrier 10 is suppressed to be damaged due to the plasma. From the same point of view, it is preferable that high frequency power for generating plasma is applied to only antenna 109 and is not applied to high frequency electrode 120 included in stage 111. It is preferable that gas supplied to vacuum chamber 103 at the time of generating the plasma is gas which does not easily etch transportation carrier 10 and substrate 1. As such gas, argon, nitrogen, helium, and the like can be exemplified. As a timing for generating the plasma, after the mounting process is finished, that is, a state in which transportation carrier 10 is mounted in stage 111 is preferable. In addition, if the carrying process is already performed, the plasma may be generated before transportation carrier 10 is mounted in stage 111.

In a case in which ESC electrode 119 is a bipolar type, after transportation carrier 10 is delivered to supporter 122, the voltage is applied to ESC electrode 119 from DC power source 126. Accordingly, holding sheet 3 is sucked to stage 111 while coming into contact with stage 111, and holding sheet 3 is fixed to stage 111.

Applying the voltage to ESC electrode 119 may be started after holding sheet 3 is mounted in stage 111 (after contacted).

(5) Determination Process

After the fixing process, for example, a determining process is performed by methods described in each embodiment as follow. In the determining process, when the contact state of holding sheet 3 and stage 111, further, the contact state of substrate 1 and stage 111 through holding sheet 3 is determined to be good, the plasma etching process to be described later is proceeded. Meanwhile, when the contact state is determined to be bad, transportation carrier 10 is taken out from vacuum chamber 103. Otherwise, supporter 122 is lifted again, transportation carrier 10 is separated from stage 111, and re-tried from the mounting process. In retrying, while lifting or dropping supporter 122, supporter 122 may be lifted and dropped a bit. Accordingly, wrinkle of holding sheet 3 becomes easily released.

(6) Plasma Etching Process

In a determining process, when the contact state is determined to be good, process gas is introduced to the inside of vacuum chamber 103 from process gas source 112 through gas introducing port 103a. Meanwhile, depressurizing mechanism 114 exhausts the gas inside vacuum chamber 103 from exhausting port 103b, and maintains the inside of vacuum chamber 103 at a predetermined pressure.

Continuously, high frequency power is applied to antenna 109 from first high frequency power source 110A, and plasma P is generated in vacuum chamber 103. Generated plasma P is made of ions, electrons, radicals, and the like. From a surface to a rear surface of a part exposed from a resist mask formed on substrate 1 are removed (etched) by physical and chemical reaction of generated plasma P, and substrate 1 is divided into individual pieces.

Here, high frequency power, for example, 100 kHz or more may be input to high frequency electrode 120 from second high frequency power source 110B. Incident energy to substrate 1 of ion can be controlled by high frequency power which is applied to high frequency electrode 120 from second high frequency power source 110B. When high frequency power is input to high frequency electrode 120, bias voltage is generated in the surface of stage 111, and ions incident to substrate 1 by the bias voltage are accelerated so that speed of etching is increased.

A condition of etching is set according to a material of substrate 1, or the like. For example, in a case in which substrate 1 is Si, when plasma which is made of sulfur hexafluoride ($SF_6$), or the like as a row material is generated inside vacuum chamber 103, substrate 1 is etched. In this case, for example, while $SF_6$ gas is supplied at 100 sccm to 800 sccm from process gas source 112, pressure of vacuum chamber 103 is controlled to be 10 Pa to 50 Pa by depressurizing mechanism 114. At this time, while high frequency power of frequency 13.56 MHz is supplied to antenna 109 at 1000 W to 5000 W, high frequency power at 50 W to 1000 W of 100 kHz or more (for example, 400 kHz to 500 kHz or 13.56 MHz) is supplied to high frequency electrode 120. The "sccm" is a unit of an amount of flowing, and 1 sccm is an amount of flowing of air in a normal state (0° C. and 1 atmospheric pressure) to 1 $cm^3$ for one minute.

In order to suppress increasing of a temperature of transportation carrier 10 during etching, it is preferable that a temperature of refrigerant circulated inside stage 111 by refrigerant circulation device 125 is set to −20° C. to 20° C. Accordingly, if the contact state of holding sheet 3 and stage 111 is good, the temperature of holding sheet 3 during the plasma process is controlled to be, for example, 60° C. or less. Therefore, thermal damage of holding sheet 3 is suppressed.

In a case of the plasma dicing, it is desirable that the surface of substrate 1 exposed from the resist mask is etched vertically. In this case, as described above, an etching step by plasma of fluorine based gas such as $SF_6$, and a protecting film deposition step by plasma of fluorocarbon gas such as perfluorocyclobutane ($C_4F_8$) may be alternately repeated.

After substrate 1 is divided into individual pieces by etching, ashing is performed. Process gas for ashing (for example, oxygen gas or mixed gas of oxygen gas and gas containing fluorine) is introduced into vacuum chamber 103 from ashing gas source 113. Meanwhile, exhausting is performed by depressurizing mechanism 114, and pressure inside vacuum chamber 103 is maintained at a predetermined pressure. Oxygen plasma is generated in vacuum chamber 103 by inputting high frequency power from first high frequency power source 110A, and the resist mask of the surface of substrate 1 (electronic component), which is exposed from window 124W of cover 124 and divided into individual pieces, is completely removed.

(7) Taking-Out Process

When ashing is finished, the gas inside vacuum chamber 103 is exhausted, and shutter 222 is opened. Transportation carrier 10 holding substrate 1 which is divided into individual pieces is taken out from plasma processing apparatus 100 by transportation arm 221 entered from shutter 222. When transportation carrier 10 is taken out, shutter 222 is promptly closed. The taking-out process of transportation carrier 10 may be performed in a reverse procedure of a procedure in which substrate 1 described above is mounted on stage 111. That is, after cover 124 is lifted to a predetermined position, applying voltage to ESC electrode 119 is made to zero, adsorption to stage 111 of transportation carrier 10 is released, and supporter 122 is lifted. After supporter 122 is lifted to a predetermined position, transportation carrier 10 is taken out.

First Embodiment

Figure 4:
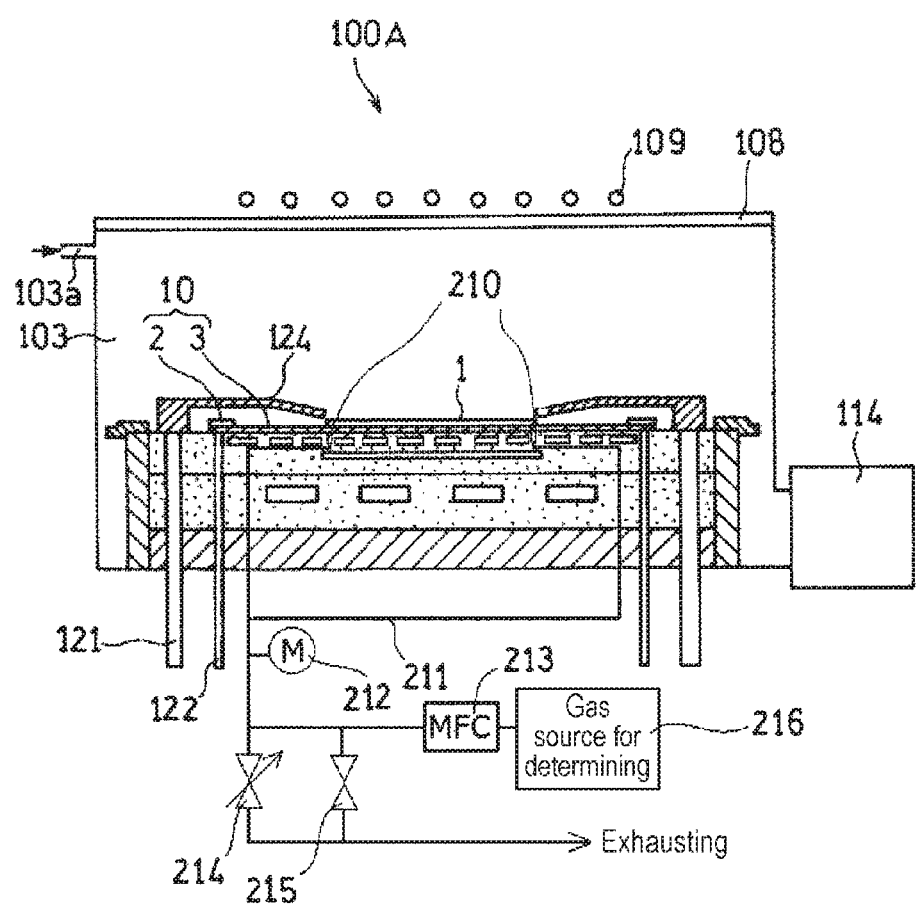
FIG. 4 is a concept diagram illustrating a part of the plasma processing apparatus according to a first embodiment of the disclosure.
Figure 5A:
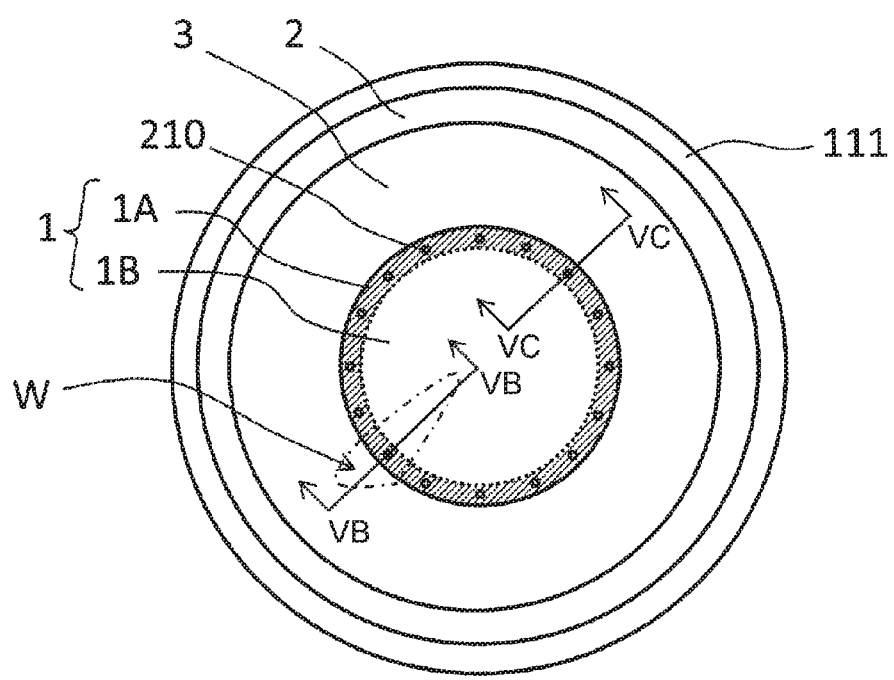
FIG. 5A is a concept diagram illustrating a stage and a gas hole for determining of the plasma processing apparatus illustrated in FIG. 4.
Figure 5B:
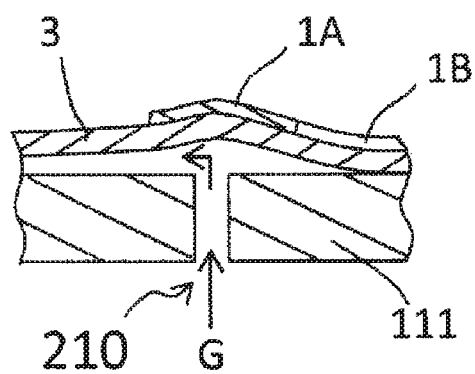
FIG. 5B is a sectional view taken along a line of VB-VB of FIG. 5A in a case in which gas for determining is introduced between the stage and the holding sheet relating to the plasma processing apparatus.
Figure 5C:
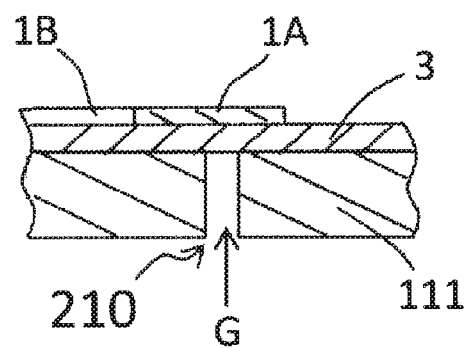
FIG. 5C is a sectional view taken along a line of VC-VC of FIG. 5A in a case in which the gas for determining is introduced between the stage and the holding sheet relating to the plasma processing apparatus.
Figure 6:
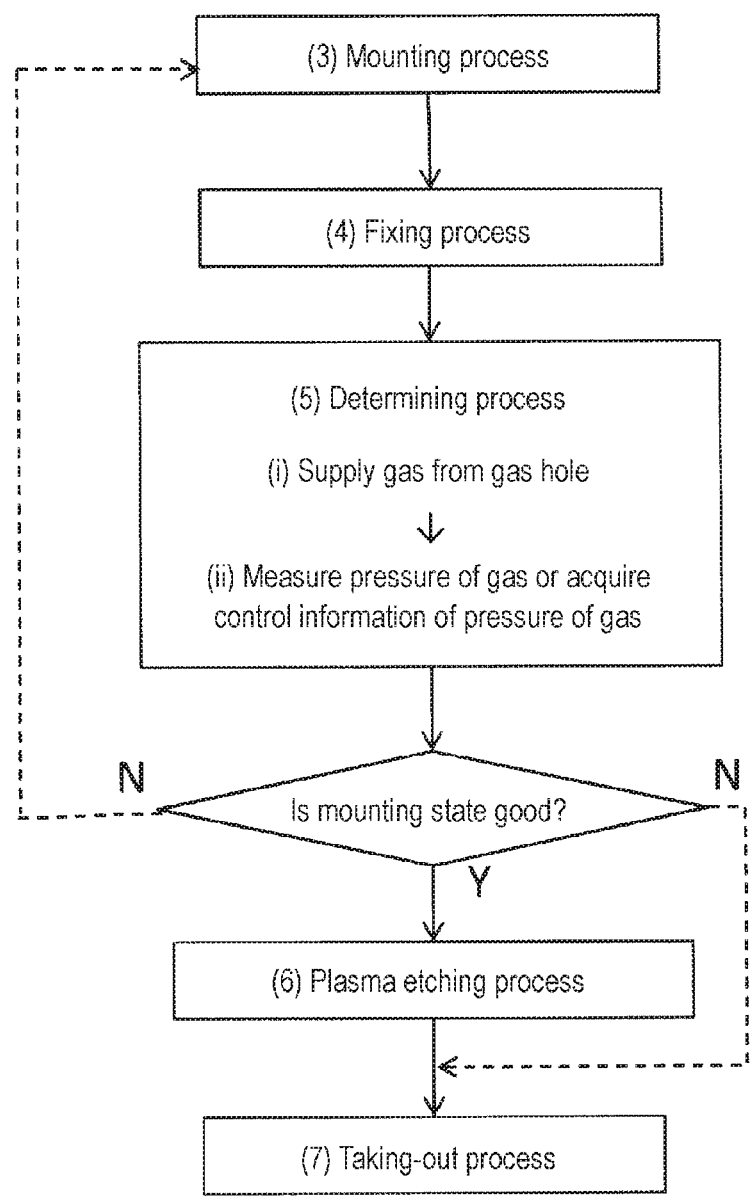
FIG. 6 is a flow chart illustrating a process of a part of the plasma processing method according to the first embodiment.
Figure 7D:
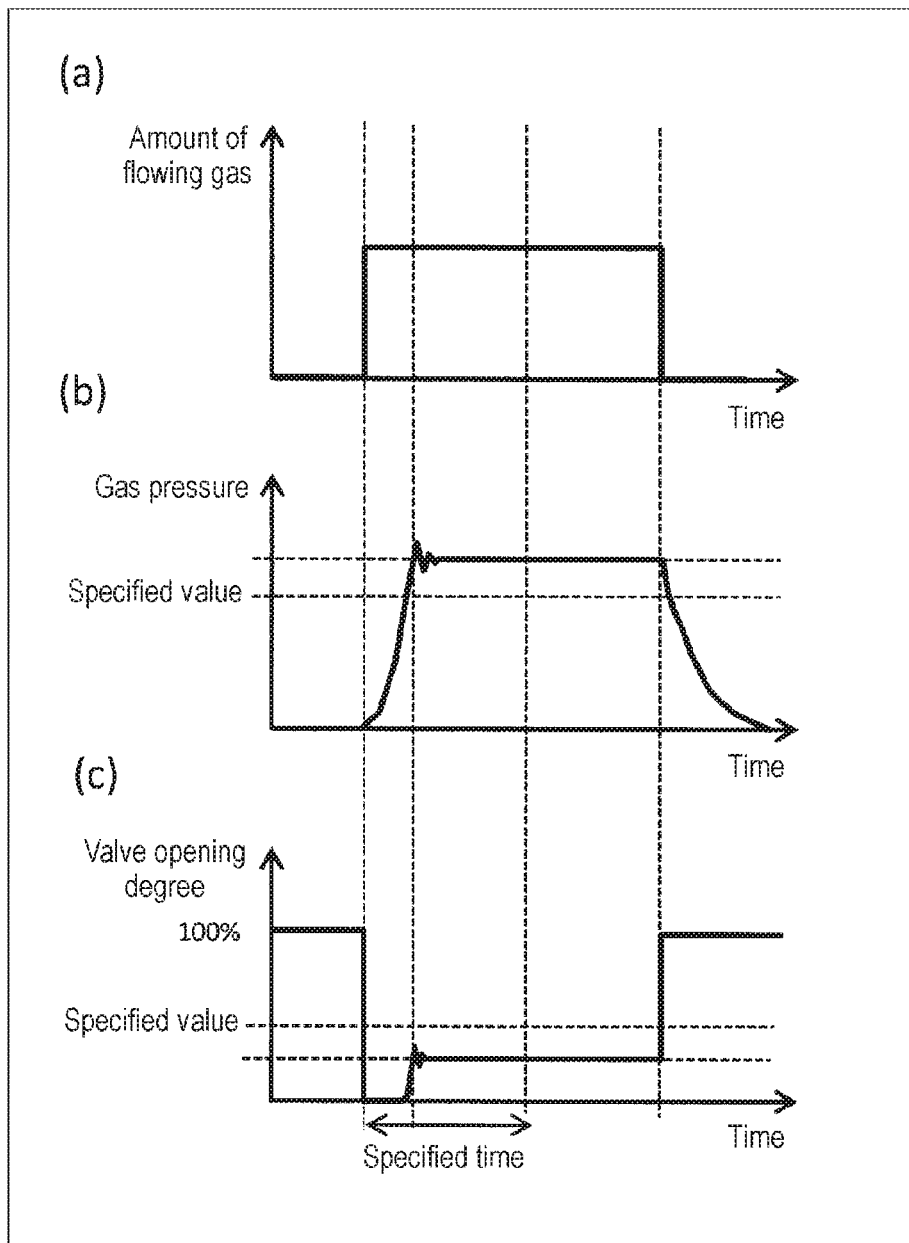
FIG. 7D is a graph ((a) to (c)) illustrating the contact state of the substrate and the stage through the holding sheet is bad, in a determining process of the plasma processing method according to the first embodiment.

Hereinafter, the plasma processing method and plasma processing apparatus 100A according to the embodiment will be described with reference to FIG. 4 to FIG. 7E. FIG. 4 is a concept diagram illustrating a part of plasma processing apparatus 100A according to the embodiment. FIG. 5A is a concept diagram illustrating stage 111 and gas hole 210 for determining of plasma processing apparatus 100A. FIG. 5B and FIG. 5C are respectively sectional views taken along a line of VB-VB and sectional view taken along a line of VC-VC which illustrate a shape at the time of introducing gas G for determining between stage 111 and holding sheet 3. FIG. 6 is a flow chart illustrating a part of the plasma processing method according to the embodiment. FIG. 7A ((a) to (c)) to FIG. 7E ((a) to (c)) are graphs illustrating the determination method of the plasma processing method according to the embodiment. Regarding (a) to (c) attached to FIG. 7A to FIG. 7E, (a) indicates a time change of a flowing amount of gas which is introduced to gas introduction passage 211, and (b) indicates a time change of pressure of gas G in gas introduction passage 211. (c) indicates a time change of a valve opening degree of pressure regulating valve 214.

Plasma processing apparatus 100A according to the embodiment is provided with gas hole 210 for determining which is connected to gas introduction passage 211 on the surface of stage 111 as illustrated in FIG. 4. As illustrated in FIG. 6, in the plasma processing method according to the embodiment, gas G is introduced between stage 111 and holding sheet 3 from gas hole 210 for determining in (5) determining process, and good or bad of the contact state of holding sheet 3 and stage 111, further, good or bad of the contact state of substrate 1 and stage 111 through holding sheet 3 are determined, in accordance with whether or not the pressure of gas G reaches a specified value within a specified time after starting introduction of gas G. Otherwise, at the time of introducing gas G between stage 111 and holding sheet 3 from gas hole 210 for determining, good or bad of the contact state of holding sheet 3 and stage 111, further, good or bad of the contact state of substrate 1 and stage 111 through holding sheet 3 are determined by control information of the pressure of gas G. The processes ((1) preparation process to (4) fixing process, (6) plasma etching process, and (7) taking-out process) other than (5) determining process may be performed in the same manner as that of each of the process. The control information of the pressure of gas G will be described later.

When substrate 1 is prepared and holding sheet 3 in which wrinkle W is generated is electrostatic-sucked to stage 111, wrinkle W may be corrected by electrostatic-adsorption. However, in a case in which electrostatic adsorption force is not enough or a case in which wrinkle W is significantly great so as not to be capable of being corrected, wrinkle W is remained even after electrostatic-adsorptioning. At this time, in a part having wrinkle W (for example, on line of VB-VB in FIG. 5A), as illustrated in FIG. 5B, gap is generated between holding sheet 3 and the surface of stage 111.

Therefore, in the part having wrinkle W, holding sheet 3 cannot be attached to the surface of stage 111, and gas hole 210 for determining is not blocked by holding sheet 3. Meanwhile, in a part not having wrinkle W (for example, on line of VC-VC in FIG. 5A), as illustrated in FIG. 5C, holding sheet 3 is attached to the surface of stage 111. Therefore, gas hole 210 for determining is blocked by holding sheet 3. As seen from the above, in accordance with presence or absence of wrinkle W, a block state due to holding sheet 3 of gas hole 210 for determining is changed. Here, in the embodiment, based on a state of gas G which is supplied to gas hole 210 for determining (pressure of gas G, control information of pressure of gas G, or the like), good or bad of the contact state of holding sheet 3 and stage 111 is determined.

Gas hole 210 for determining is positioned on, for example, the surface of stage 111 as illustrated in FIG. 5A, and thus it is preferable that the gas hole is formed on a position corresponding to the outer circumferential part 1A of mounted substrate 1. The outer circumferential part 1A of substrate 1 indicates, for example, a region inside 1 mm to 3 mm from outer circumference of substrate 1. A region other than the outer circumferential part 1A of substrate 1 is set to center 1B. When gas hole 210 for determining is formed on a position corresponding to the outer circumferential part 1A of substrate 1, the gas hole is mainly provided on center 1B of substrate 1, and thus good or bad of the contact state of substrate 1 and stage 111 through holding sheet 3 can be determined without adversely affecting an element region included in a circuit layer described above, or the like. In FIG. 5A to FIG. 5C, for convenience, the outer circumferential part 1A is illustrated with hatching.

In a position of the surface of stage 111, which corresponds to center 1B of substrate 1 (particularly, element region), it is desirable that gas hole 210 for determining is not provided. When gas hole 210 for determining is formed on center 1B of substrate 1, there is a case in which, adverse effect such as local uneven of plasma-etching is generated in the surface of substrate 1 of the vicinity of gas hole 210 for determining. It is considered that a shape of plasma sheath generated between substrate 1 and an interface of the plasma is distorted in the vicinity of gas hole 210 for determining, during the plasma process. Particularly, in the plasma dicing in which substrate 1 is divided into individual pieces by the plasma process, substrate 1 mounted on stage 111 through holding sheet 3 is etched by the plasma until reaching the surface of holding sheet 3, and thereby easily being affected by gas hole 210 for determining. In this case, if substrate 1 is thin, further it is easily affected by gas hole 210 for determining.

It is preferable that gas hole 210 for determining is formed at equivalent intervals on a position corresponding to the outer circumferential part 1A as illustrated in FIG. 5A. Accordingly, a detection accuracy of the contact state of substrate 1 and stage 111 through holding sheet 3 can be increased. A reason thereof will be described as follows.

Wrinkle W of holding sheet 3 is generated because holding sheet 3 is loosened. Meanwhile, since the vicinity of holding sheet 3 is fixed by frame 2, it has appropriate tension. Therefore, wrinkle W generated in holding sheet 3 is generated in a part close to frame 2 of holding sheet 3, traverses a region which is not held by substrate 1 of holding sheet 3, and there are many cases in which the wrinkle has a shape of reaching a region which is held by substrate 1. That is, wrinkle W which is generated in the region held by substrate 1 is formed to traverse the outer circumferential part 1A of substrate 1 in most cases. Accordingly, when gas hole 210 for determining is disposed at equivalent intervals on a position corresponding to the outer circumferential part 1A of substrate 1 of the surface of stage 111, the contact state of a substantial entire surface substrate 1 can be checked.

In a case in which gas hole 210 for determining is disposed on the surface of stage 111 corresponding to the outer circumferential part 1A, it is preferable that gas hole 210 for determining is disposed at an interval from 20 mm to 100 mm in accordance with an exterior shape of the outer circumferential part 1A. Particularly, from a point of view of manufacturing costs, or the like of stage 111 by providing gas hole 210 for determining, it is preferable that gas hole 210 for determining is disposed at an interval of substantially 50 mm. The number of gas hole 210 for determining may be appropriately set in accordance with a size of substrate 1. For example, gas hole 210 for determining may be disposed substantially 12 in a case in which diameter of substrate 1 is 200 mm, and gas hole 210 for determining may be disposed substantially 16 in a case in which diameter of substrate 1 is 300 mm.

A shape of gas hole 210 for determining is not particularly limited, and may be circular, elliptical, polygonal (square, hexagonal shape, and the like) shape, and the like. A size of gas hole 210 for determining is also not particularly limited, and may be a size of which the gas hole is accommodated in the outer circumferential part 1A. Regarding the size of gas hole 210 for determining, a diameter of a circle having the same area is preferably, for example, 0.3 mm to 1.0 mm, and may be 0.5 mm to 0.8 mm. Particularly, from a point of view of improving non-uniformity of plasma etching caused by gas hole 210 for determining described above, the size of gas hole 210 for determining may be further reduced to have a small diameter (for example, 0.05 mm to 0.3 mm). In a case in which the diameter of gas hole 210 for determining is reduced, gas hole 210 for determining may be disposed at center 1B of substrate 1. However, in this case, it is preferable that the pressure of gas G supplied from gas hole 210 for determining is reduced. In a case in which the diameter of gas hole 210 for determining is reduced, particularly, in a case in which substrate 1 is thin, holding sheet 3 can be bent by the pressure of gas G supplied from gas hole 210 for determining. Therefore, in a subsequence plasma dicing, plasma sheath may be deformed, and further, failure, such as non uniformity of etching may be generated.

The types of gas G for determining are not particularly limited, and a type of gas which does not affect plasma etching may be used. As gas G for determining, for example, helium, argon, nitrogen, and the like are exemplified.

As illustrated in FIG. 4, gas hole 210 for determining is connected to gas introduction passage 211. In gas introduction passage 211, manometer 212 measuring the pressure of gas in gas introduction passage 211, flow controller (MFC) 213 for regulating an amount of flowing gas, pressure regulating valve 214 regulating the pressure of gas G for determining, bypass valve 215 for exhausting gas G, gas source 216 for determining, and the like are connected. In a case in which there are many gas hole 210 for determining, gas introduction passage 211 is branched, and all gas hole 210 for determining may be connected to gas introduction passage 211. The amount of flowing gas G supplied from gas source 216 for determining is regulated to be a predetermined amount in MFC 213, and the gas is supplied to gas introduction passage 211. Based on pressure of gas inside gas introduction passage 211 measured by manometer 212, when valve opening degree of pressure regulating valve 214 is regulated, the pressure of the gas inside gas introduction passage 211 can be regulated to a predetermined pressure. Gas G inside gas introduction passage 211 is exhausted by opening bypass valve 215.

In the determining process, based on the pressure of gas G in gas introduction passage 211 or control information of the pressure of gas G, the contact state is determined. FIG. 7A ((b) and (c)) is a graph in a case in which the contact state is determined to be good. FIG. 7B ((b) and (c)) and FIG. 7C ((b) and (c)) is a graph in a case in which the contact state is determined to be bad.

In the determining process, gas G is introduced to gas introduction passage 211 by a predetermined pressure (FIG. 7A (a)). At this time, in a case in which the pressure of gas G in gas introduction passage 211 reaches a specified value within a specified time from starting introduction of gas G (FIG. 7A (b)), the contact state of holding sheet 3 and stage 111 is determined to be good, and the contact state of substrate 1 and stage 111 through holding sheet 3 is determined to be good. In a case in which the contact state of holding sheet 3 and stage 111 is good, adhesion of holding sheet 3 and stage 111 is high, leaking of gas from gap between holding sheet 3 and stage 111 is reduced. In order to determining the contact state, control information of the pressure of gas G may be used (FIG. 7A (c)). As the control information of the pressure of gas G, for example, information relating to valve opening degree of pressure regulating valve 214, or stability of the valve opening degree can be used. In a case in which the valve opening degree of pressure regulating valve 214 is used, for example, in a case in which a specified value is set with respect to the valve opening degree of pressure regulating valve 214, and the valve opening degree in a state in which the pressure of gas G is regulated to a predetermined pressure exceeds the specified value, the contact state described above may be determined to be good. In a case in which information relating to stability of the valve opening degree of pressure regulating valve 214 is used, for example, in a case in which, valve opening degree is maintained in a state of exceeding the specified value during elapsing the monitoring time after monitoring time is set and the pressure of gas G is regulated to be a predetermined pressure, the contact state described above may be determined to be good.

Meanwhile, as illustrated in FIG. 7B, even when gas G is introduced to gas introduction passage 211 with a predetermined amount of flowing (FIG. 7B (a)), in a case in which the pressure of gas in gas introduction passage 211 does not reach the specified value within a specified time from starting introduction of gas G (FIG. 7B (b)), the contact state of holding sheet 3 and stage 111 is bad, and further, the contact state of substrate 1 and stage 111 through holding sheet 3 is determined to be bad. It is concerned that gas G for determining is leaked from the gap between holding sheet 3 and stage 111. In this case, as illustrated in FIG. 7B (c), the valve opening degree in a state in which the pressure of gas G is regulated to a predetermined pressure does not exceed the specified value within the specified time.

Here, graphs (b) and (c) of FIG. 7B illustrate a case in which leaking of gas G is excessive. In a case in which leaking of gas G is moderate, the pressure and the valve opening degree of gas G are respectively illustrated in FIG. 7C ((b) and (c)). FIG. 7C (a) illustrates that gas G is introduced to gas introduction passage 211 at a predetermined amount of flowing as same as FIG. 7B (a). In FIG. 7C (b), the pressure of gas G reaches the specified value, but a required time thereof exceeds the specified time. As well as FIG. 7C (c), the valve opening degree reaches the specified value, but a required time thereof exceeds the specified time.

In a case in which the valve opening degree of pressure regulating valve 214 is mainly used for determining the contact state, like graphs illustrated in FIG. 7D ((a) to (c)), the contact state described above may be determined as follows. For example, when gas G is introduced to gas introduction passage 211 at a predetermined amount of flowing, the pressure of gas G reaches the specified value within the specified time (FIG. 7D (b)), but the contact state described above may be determined to be bad, in a case in which the valve opening degree does not reach the specified value (FIG. 7D (c)).

In a case in which the monitoring time of the valve opening degree of pressure regulating valve 214 is set, and the valve opening degree within the monitoring time is mainly used for determining the contact state, like graphs of FIG. 7E ((a) to (c)), the contact state described above may be determined as follows. For example, when gas G is introduced to gas introduction passage 211 at a predetermined amount of flowing, the pressure of gas G reaches the specified value within the specified time (FIG. 7E (b)), but the contact state described above may be determined to be bad, in a case in which the valve opening degree is lower than the specified value within the monitoring time (FIG. 7E (c)).

Figure 7E:
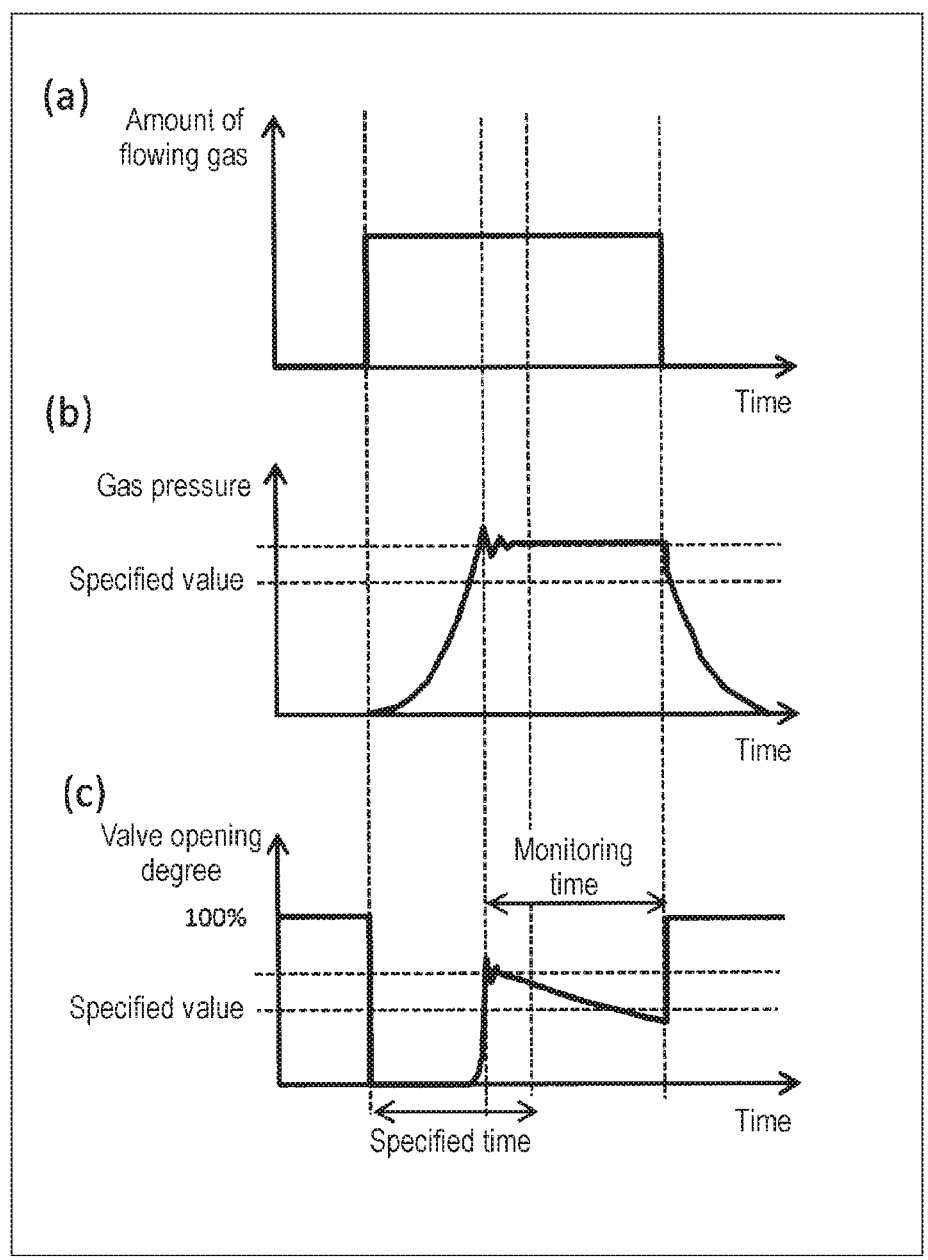
FIG. 7E is a graph ((a) to (c)) illustrating the contact state of the substrate and the stage through the holding sheet is bad, in a determining process of the plasma processing method according to the first embodiment.

The graphs illustrated in FIG. 7I) and FIG. 7E can be easily obtained in a case in which leaking of gas G is smaller than that of cases of FIG. 7B and FIG. 7C.

In a case in which the plasma etching process is performed after finishing the determining process, it is preferable that bypass valve 215 is opened and gas G remained in gas introduction passage 211 is exhausted after finishing the determining process. In a case in which a electrostatic adsorption force with respect to stage 111 of holding sheet 3 is weak, or when a thickness of substrate 1 is reduced according to proceeding of plasma etching, substrate 1 is easily bent. Therefore, when the plasma etching process is performed in a state in which gas G is remained in gas introduction passage 211, there is a case in which substrate 1 near gas hole 210 for determining is floated with holding sheet 3 from stage 111 by the remained pressure of gas G. When substrate 1 is floated from stage 111, trouble such as abnormality of processing shape, abnormal electric discharge, or the like is easily generated. Further, since adhesion of holding sheet 3 and stage 111 is deteriorated, holding sheet 3 is less likely to be sufficiently cooled.

Second Embodiment

Figure 8:
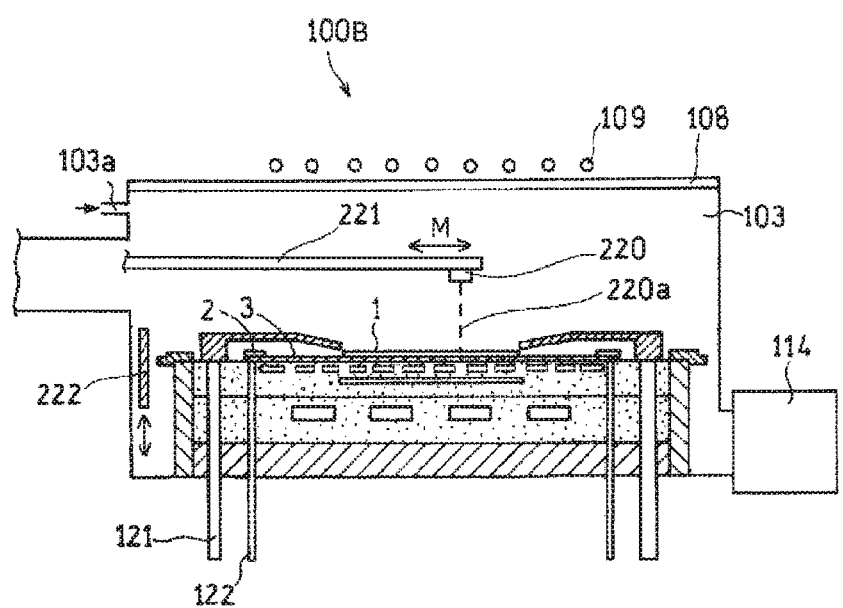
FIG. 8 is a concept diagram illustrating a part of a plasma processing apparatus according to a second embodiment.
Figure 9:
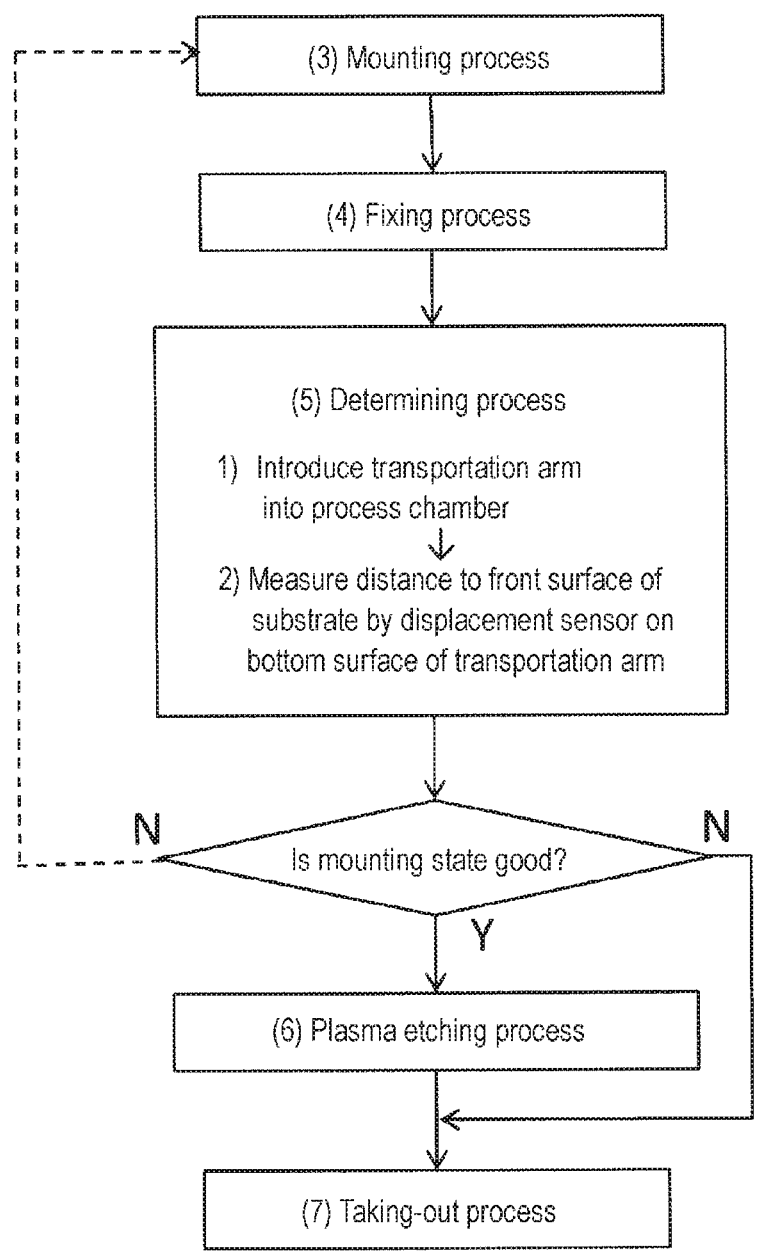
FIG. 9 is a flow chart illustrating a process of a part of the plasma processing method according to the second embodiment.
Figure 10:
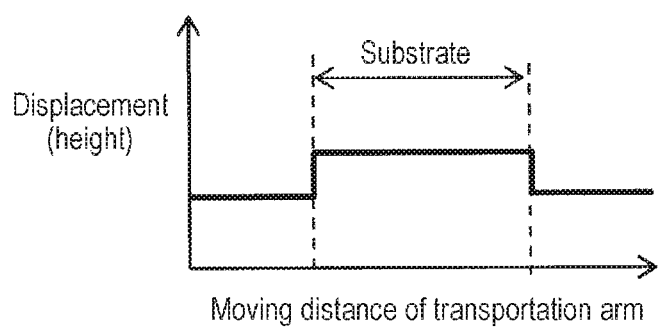
FIG. 10 is a graph ((a) and (b)) illustrating a determination method of the plasma processing method according to the second embodiment.
Figure 10:
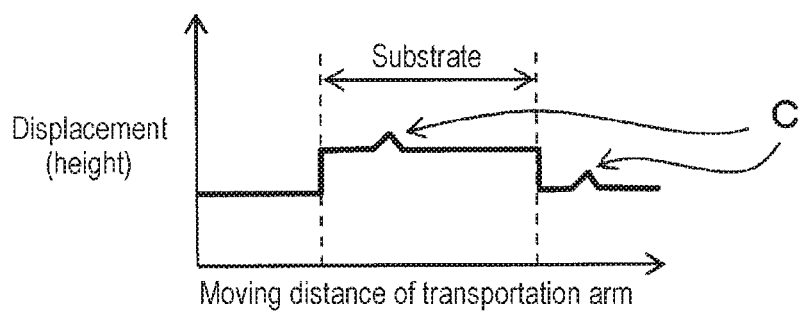

This embodiment is the same as the first embodiment, other than that plasma processing apparatus 100B is switched to gas hole 210 for determining, and displacement sensor 220 is included as illustrated in FIG. 8. Hereinafter, the plasma processing method and plasma processing apparatus 100B according to the embodiment will be described with reference to FIG. 8 to FIG. 10. FIG. 8 is a concept diagram illustrating a part of plasma processing apparatus 100B used as the embodiment. FIG. 9 is a flow chart illustrating a part of the plasma processing method according to the embodiment. FIG. 10 ((a) and (b)) is a graph illustrating the determination method of the plasma processing method according to the embodiment. FIG. 10 (a) is a graph in which a height from stage 111 of substrate 1 is constant, and FIG. 10 (b) is a graph in which minute displacement C is seen in the height from stage 111 of substrate 1.

In the plasma processing method according to the embodiment, as illustrated in FIG. 9, the contact state is determined on the basis of a height of the surface of substrate 1 fixed to stage 111, which is measured by displacement sensor 220 in (5) determining process. The processes ((1) preparation process to (4) fixing process, (6) plasma etching process, and (7) taking-out process) other than (5) determining process are performed in the same manner as that of each of the process. As illustrated in FIG. 8, displacement sensor 220 is mounted on, for example, a surface facing stage 111 of transportation arm 221. Transportation carrier 10 is carried in vacuum chamber 103 by transportation arm 221, and is mounted in stage 111, and then transportation arm 221 is moved again above stage 111 in which substrate 1 is mounted. At this time, displacement sensor 220 measures a distance between displacement sensor 220 and substrate 1. The types of displacement sensor 220 is not particularly limited, but non contacting type of the sensor is preferable. As non contacting type displacement sensor 220, an optical type (laser), and eddy current type, an ultrasonic type, and the like are exemplified. Among them, in terms of the sensor which is capable of measured with short measuring time, displacement sensor 220 using laser light is preferable. In this case, displacement sensor 220 is provided with an irradiator of laser light 220a and a receiver receiving laser light 220a which is diffused and reflected (neither is illustrated). Displacement sensor 220 almost vertically applies laser light 220a to substrate 1 and receives the diffused and reflected light reflected from substrate 1. From an imaging position at this time, a distance from displacement sensor 220 to substrate 1 is measured. A distance between displacement sensor 220 and substrate 1 can be measured on at least solid line through substrate 1 by moving transportation arm 221.

As illustrated in FIG. 10 (a), in a case in which a height from stage 111 of substrate 1 is constant, the contact state of substrate 1 and stage 111 through holding sheet. 3 is determined to be good. Meanwhile, as illustrated in FIG. 10 (b), in a case in which minute displacement C is seen in a height from stage 111 of substrate 1, wrinkle is generated in substrate 1 and holding sheet 3, and the contact state of substrate 1 and stage 111 through holding sheet 3 is determined to be bad. In addition, a height from stage 111 of holding sheet 3 may be added to one of materials for determining the contact state. In this case, in a case in which minute displacement C is seen in the height from stage 111 of holding sheet 3, it is determined that wrinkle is generated in holding sheet 3.

Third Embodiment

Figure 11:
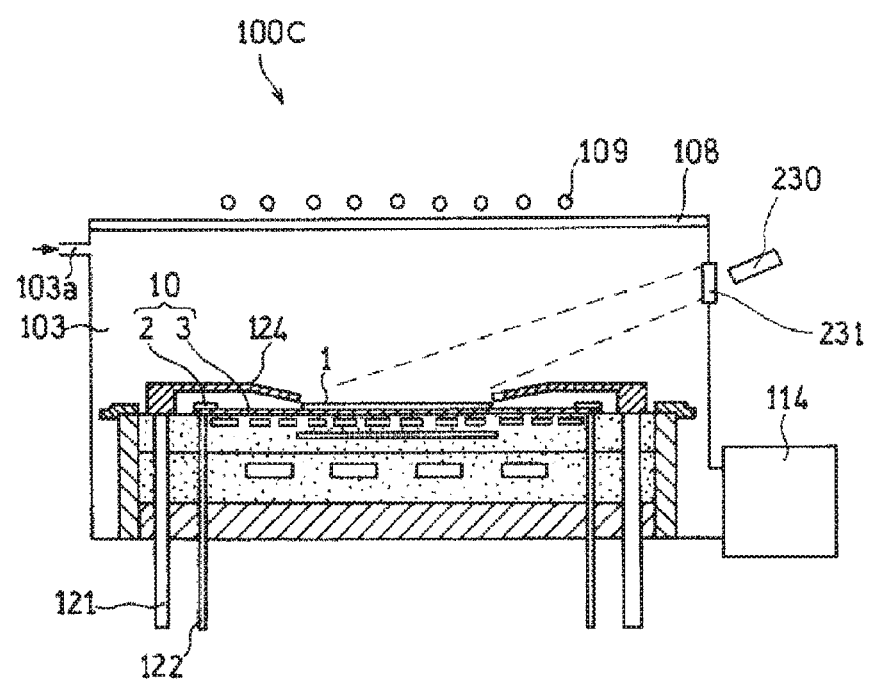
FIG. 11 is a concept diagram illustrating a part of a plasma processing apparatus according to a third embodiment.
Figure 12:
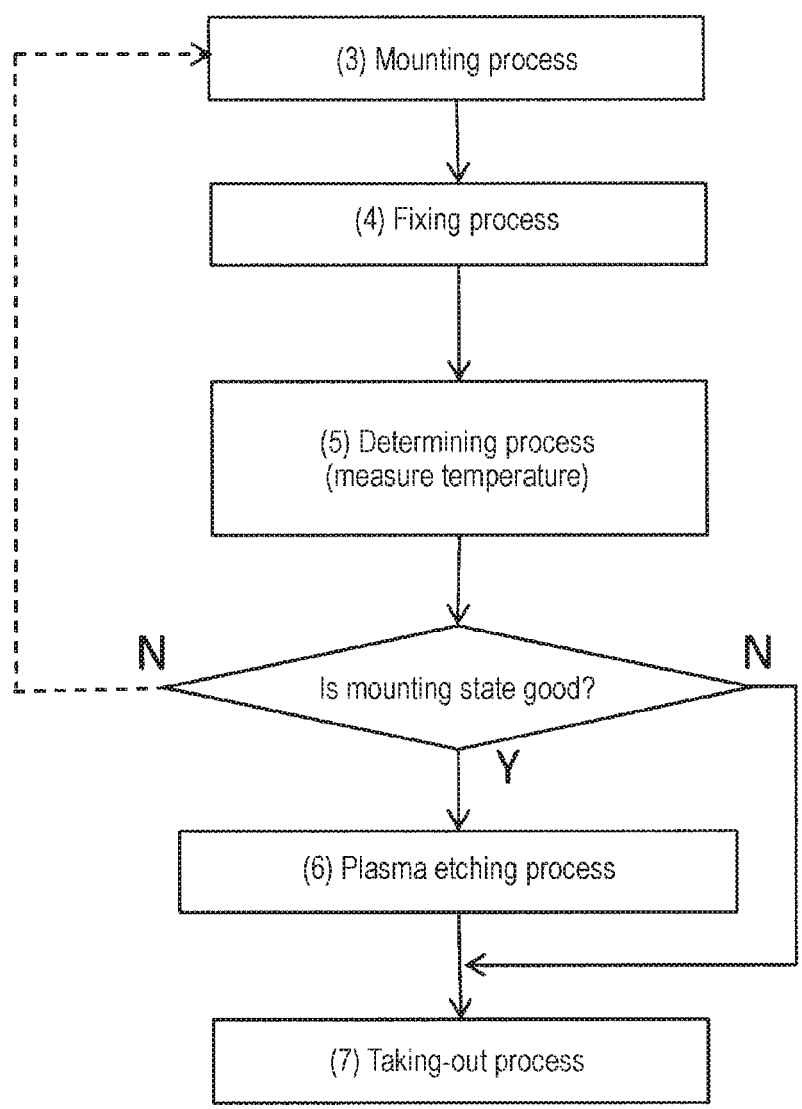
FIG. 12 is a flow chart illustrating a process of a part of a plasma processing method according to the third embodiment.
Figure 13:
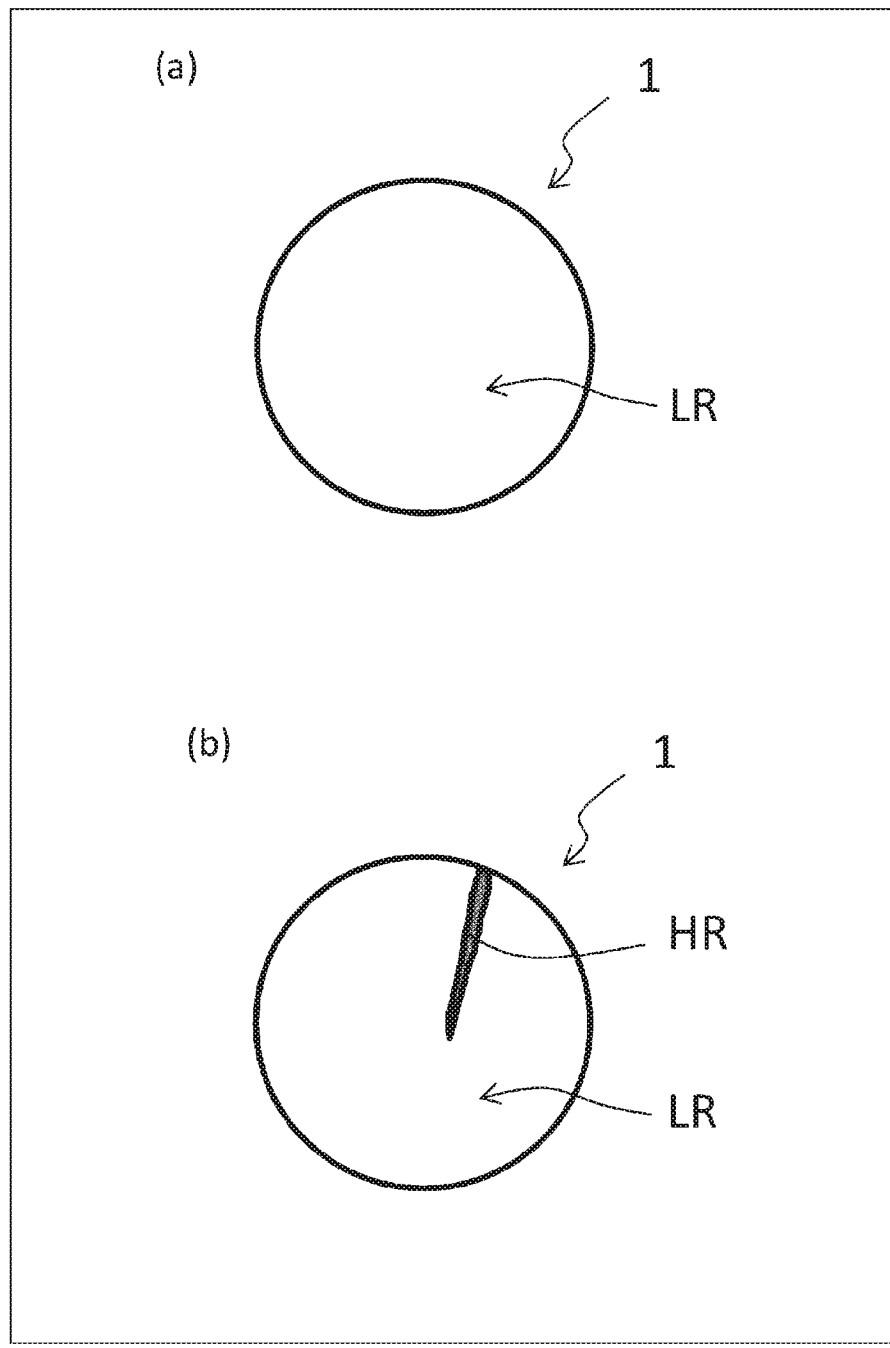
FIG. 13 is a top view ((a) and (b)) illustrating a determination method of the plasma processing method according to the third embodiment.

This embodiment is the same as the first embodiment, other than that plasma processing apparatus 100C is switched to gas hole 210 for determining, and temperature sensor 230 is included as illustrated in FIG. 11. Hereinafter, the plasma processing method and plasma processing apparatus 100C according to the embodiment will be described with reference to FIG. 11 to FIG. 13. FIG. 11 is a concept diagram illustrating a part of plasma processing apparatus 100C used for the embodiment. FIG. 12 is a flow chart illustrating a part of the plasma processing method according to the embodiment. FIG. 13 ((a) and (b)) is a top view illustrating the determination method of the plasma processing method according to the embodiment. FIG. 13 (a) is a top view in a case of including region LR in which a temperature of the surface of substrate 1 is uniformly low (for example, 0° C. or less). FIG. 13 (b) is a top view in a case in which region HR having high temperature (for example, 10° C. or more) is provided in at least a part of the surface of substrate 1.

In the plasma processing method according to the embodiment, as illustrated in FIG. 12, the contact state is determined on the basis of the temperature of the surface of substrate 1 fixed to stage 111, which is measured by temperature sensor 230, in (5) determining process. In the embodiment, since stage 111 is cooled at, for example, −10° C. or less, in a case in which the contact state of substrate 1 is good, the temperature of the surface of substrate 1 is uniformly low. The processes ((1) preparation process to (4) fixing process, (6) plasma etching process, and (7) taking-out process) other than (5) determining process are performed in the same manner as that of each of the process.

The types of temperature sensor 230 is not particularly limited, but non contacting type of the sensor is preferable. As non contacting type temperature sensor 230, a radiation thermometer measuring infrared radiation energy is preferably exemplified. Viewing port (viewing window) 231 is provided above vacuum chamber 103, and thus an inside of vacuum chamber 103 can be recognized.

Temperature sensor 230 such as a radiation thermometer is provided outside vacuum chamber 103, for example, so as to face this viewing port 231.

Temperature sensor 230 measures the temperature of the surface of substrate 1 by, for example, measuring infrared radiation energy radiated from the surface of substrate 1.

As illustrated in FIG. 13 (a), in a case of including region LR in which a temperature of the surface of substrate 1 is uniformly low (for example, 0° C. or less), the contact state of substrate 1 and stage 111 through holding sheet 3 is determined to be good. Meanwhile, as illustrated in FIG. 13 (b), in a case in which region HR having high temperature (for example, 10° C. or more) is provided in at least a part of the surface of substrate 1, the contact state of substrate 1 and stage 111 through holding sheet 3 is determined to be bad.

The plasma processing method is useful as a method in which a substrate held by the holding sheet is plasma-processed.

What is claimed is:

1. A plasma processing method comprising:
   a mounting process of mounting a holding sheet holding a substrate, in a stage provided in a plasma processing apparatus;
   a fixing process of fixing the holding sheet to the stage;
   a determining process of determining whether or not a contact state of the holding sheet with the stage is good or bad after the fixing process; and
   a plasma etching process of etching the substrate by exposing a surface of the substrate to plasma on the stage, in a case in which the contact state is determined to be good in the determining process
   wherein the plasma processing apparatus includes a plurality of gas holes for determining, which are formed on a surface of the stage and connected to a gas introduction passage, and
   wherein, in the determining process, gas is introduced between the stage and the holding sheet from the plurality of gas holes for determining, and the contact state is determined on the basis of a pressure of the gas in the gas introduction passage or control information of the pressure.

2. The plasma processing method of claim 1,
   wherein the plasma processing apparatus includes a displacement sensor which measures a height of the surface of the substrate mounted on the stage, and
   wherein, in the determining process, the height of the surface of the substrate mounted on the stage is measured by the displacement sensor, and the contact state is determined on the basis of the measured height of the surface of the substrate.

3. The plasma processing method of claim 1,
   wherein the plasma processing apparatus includes a cooler for cooling the stage and a temperature sensor, and
   wherein, in the determining process, a temperature of the substrate mounted on the stage is measured by the temperature sensor, and the contact state is determined on the basis of the measured temperature of the substrate.

4. The plasma processing method of claim 1,
   wherein the contact state is determined to be good when there is no wrinkle in the holding sheet.

5. The plasma processing method of claim 1,
   wherein the contact state is determined to be good when the pressure of gas in the gas introduction passage reaches a specified value within a specified time from starting introduction of the gas.

6. The plasma processing method of claim 1,
   wherein the contact state is determined to be good when a valve opening degree of a pressure regulating valve for regulating the pressure of gas exceeds a specified value when the pressure of gas is regulated to a predetermined pressure.

7. The plasma processing method of claim 1,
   wherein the contact state is determined to be good when a valve opening degree of a pressure regulating valve for regulating the pressure of gas is maintained in a state of exceeding the specified value for a specified time, after the pressure of gas is regulated to a predetermined pressure.

8. The plasma processing method of claim 1,
   wherein the gas hole is formed on a position corresponding to an outer circumferential part of the substrate mounted on the stage.

9. The plasma processing method of claim 8,
   wherein the outer circumferential part is a region inside 1 mm to 3 mm from an outer circumference of the substrate.

10. The plasma processing method of claim 1,
    wherein each of the plurality of gas holes is formed on a position corresponding to an outer circumferential part of the substrate mounted on the stage.

11. The plasma processing method of claim 10,
    wherein each of the plurality of gas holes is formed at equivalent intervals.

12. A plasma processing method of claim 1,
    wherein in the fixing process, the holding sheet is fixed to the stage by applying a voltage to an electrode for electrostatic chucking disposed inside the stage.

* * * * *